United States Patent [19]

Ochi et al.

[11] Patent Number: 5,680,068

[45] Date of Patent: Oct. 21, 1997

[54] SEMICONDUCTOR INTEGRATED CIRCUIT FOR SUPPRESSING OVERSHOOTING AND RINGING

[75] Inventors: Shinji Ochi, Yokohama; Yasunori Tanaka, Yokosuka; Tomohiro Fujisaki, Koto-ku, all of Japan

[73] Assignee: Kabushiki Kaisha Toshiba, Kawasaki, Japan

[21] Appl. No.: 546,108

[22] Filed: Oct. 20, 1995

[30] Foreign Application Priority Data

Oct. 21, 1994  [JP] Japan .................. 6-257112

[51] Int. Cl.⁶ ..................... H03K 19/094; H03L 5/00
[52] U.S. Cl. ..................... 327/333; 327/321; 326/81
[58] Field of Search ..................... 327/309, 310, 327/313, 321, 322, 328, 333, 327, 379, 387, 389, 391, 399, 108, 112; 326/80, 81, 83, 85

[56] References Cited

U.S. PATENT DOCUMENTS

| | | | |
|---|---|---|---|
| 4,926,070 | 5/1990 | Tanaka et al. | 326/81 |
| 4,963,766 | 10/1990 | Lundberg | 326/58 |
| 5,124,585 | 6/1992 | Kim et al. | 326/87 |
| 5,136,191 | 8/1992 | Nunogami | 326/81 |
| 5,144,165 | 9/1992 | Dhong et al. | 326/80 |
| 5,223,751 | 6/1993 | Simmons et al. | 326/81 |
| 5,406,140 | 4/1995 | Wert et al. | 326/68 |
| 5,436,585 | 7/1995 | DiMarco | 327/333 |
| 5,537,059 | 7/1996 | Asahina | 326/81 |
| 5,559,464 | 9/1996 | Orii et al. | 327/333 |

*Primary Examiner*—Timothy P. Callahan
*Assistant Examiner*—My-Trang Nu Ton
*Attorney, Agent, or Firm*—Foley & Lardner

[57] ABSTRACT

There is provided a semiconductor integrated circuit including an output circuit having a first buffer section to which a first power supply voltage is applied and an input signal is supplied to amplify and output the input signal, and a second buffer section to which a second power supply voltage is applied and a signal output from said first buffer section is supplied to amplify and output the signal outside through an output terminal, a switching element which has two terminals respectively connected to said output terminal and a ground voltage terminal and receives a control signal to change a conductive resistance, and a bias circuit for receiving the input signal or a signal output from said first buffer section, generating a control signal, and supplying the control signal to said switching element to control the conductive resistance of said switching element so as not to allow a potential of said output terminal to exceed a predetermined value.

11 Claims, 7 Drawing Sheets

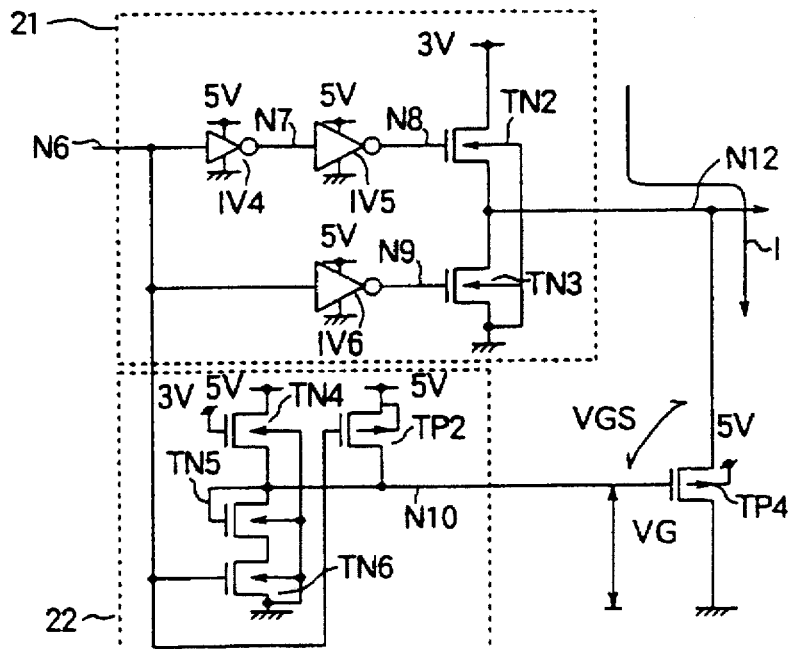
F I G. 3
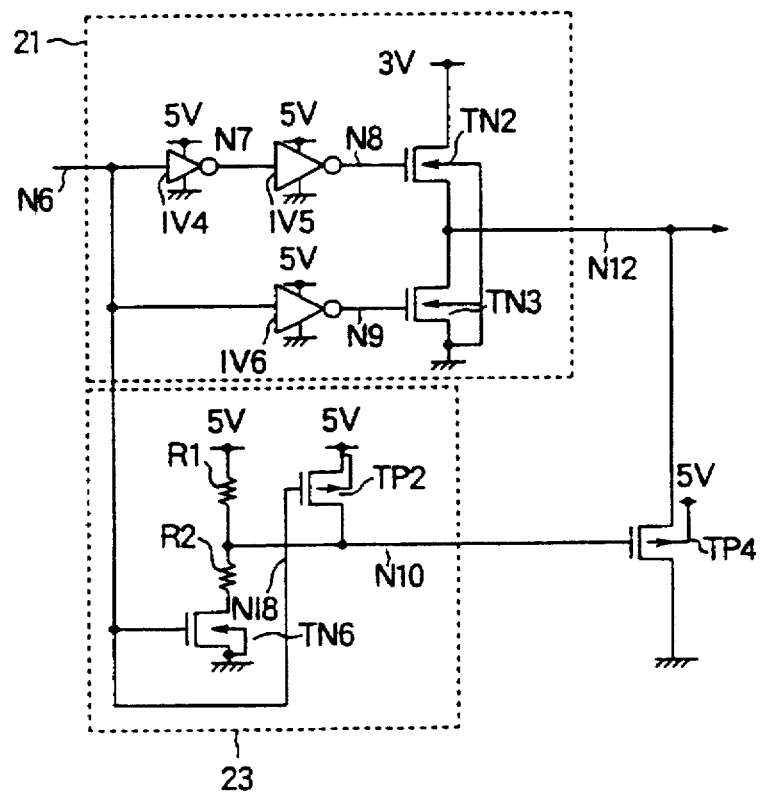
F I G. 4

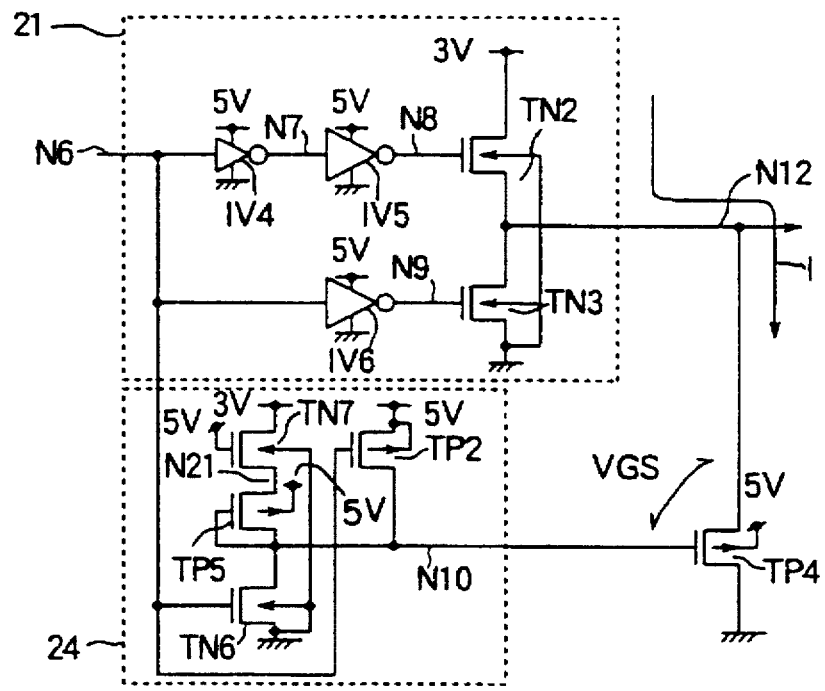
F I G. 5
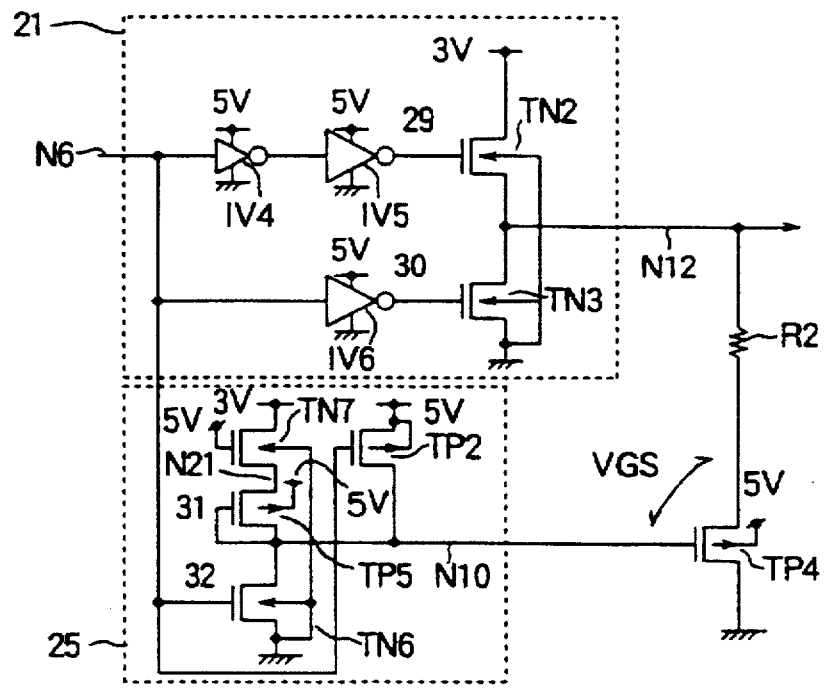
F I G. 6

SEMICONDUCTOR INTEGRATED CIRCUIT FOR SUPPRESSING OVERSHOOTING AND RINGING

BACKGROUND OF THE INVENTION

The present invention relates to a semiconductor integrated circuit and, more particularly, to a semiconductor integrated circuit having an output circuit.

When two integrated circuits which operate at different power supply voltages are to be connected to each other, the following interface must be used not to cause an operation error.

FIG. 1 shows a conventional arrangement used when an integrated circuit chip 11 including a logic circuit 11a, which operates at a power supply voltage of 5 V, is to be connected to an integrated circuit chip 12 including a logic circuit 12a, which operates at a power supply voltage of 3 V. A signal output from the logic circuit 11a is input to an output buffer 11b, which operates at a power supply voltage of 3 V, and then output outside from an output terminal 13. This output signal swings within the range of 0 to 3 V, as shown in FIG. 1. This signal is input to the integrated circuit chip 12 to be supplied to an input buffer 12b, which operates at a power supply voltage of 3 V. The signal is input to the logic circuit 12a, which operates at a power supply voltage of 3 V equal to that of the input buffer 12b.

In this manner, in the integrated circuit chip 11 including the logic circuit 11a, which operates at a power supply voltage of 5 V, only the output circuit portion is operated at 3 V to output a signal having an amplitude width of 3 V to the logic circuit 12a, which operates at 3 V.

FIG. 2 shows a detailed circuit arrangement of the output circuit portion which converts a signal having an amplitude width of 5 V into a signal having an amplitude width of 3 V. An output buffer comprises a pre-buffer section and a main buffer section. The pre-buffer section of a transistor TN0 included in the main buffer section has two inverters IV1 and IV2 connected in series with each other between an input terminal N1 and a node N3. The pre-buffer section of a transistor TN1 included in the main buffer section has an inverter IV3 connected between the input terminal N1 and a node N4. Each of the inverters IV1 to IV3 operates at a power supply voltage of 5 V.

The main buffer section operates at a power supply voltage of 3 V, unlike the pre-buffer section. N-channel MOS transistors (to be referred to as N-type Trs) TN0 and TN1 are connected in series with each other between a 3-V power supply voltage terminal and a ground voltage terminal. An output from the inverters IV1 and IV2 in the pre-buffer section is supplied to the gate of the N-type MOS transistor TN0 in the main buffer section. An output from the inverter IV3 in the main buffer section is input to the gate of the N-type Tr TN1 in the main buffer section.

The operation of the output circuit having such an arrangement will be described. When a high-level input signal of 5 V is input from the input terminal N1, an output node N2 of the inverter IV1 and the output node N4 of the inverter IV3 are set to low level (0 V), and the output node N3 of the inverter IV2 is set to high level (5 V). With this operation, the N-type Tr TN0 is turned on, and the N-type Tr TN1 is turned off, thereby outputting a signal of high level (3 V) outside from an output node N5. To the contrary, when an input signal of low level is input, the n-type Tr TN0 is turned off, and the n-type Tr TN1 is turned on to output a signal of low level.

This conventional output circuit, however, has the following problem. That is, a parasitic capacitance is present between the transistor and the power supply voltage terminal or the ground voltage terminal or in the output node N5 of the output circuit due to an IC package. This parasitic capacitance causes overshooting and ringing. FIG. 9 shows a change in output waveform obtained when overshooting and ringing occur. When the level of an input signal changes from low level to high level (5 V), the level of the output node N3 changes from low level to high level. Although the output level should be constant at 3 V, the output level overshoots to 3 V or more, and ringing causes transient phenomena.

If the level of the output node N5 overshoots over 3 V, both the N-type Trs TN0 and TN1 are completely turned off. As a result, an external load connected to the output node N5 holds an output level over 3 V, and the output level is determined in accordance with this holding state.

SUMMARY OF THE INVENTION

It is, therefore, an object of the present invention to provide a semiconductor integrated circuit in which overshooting and ringing can be suppressed.

According to the present invention, there is provided a semiconductor integrated circuit comprising: an output circuit having a first buffer section to which an input signal is supplied and a first power supply voltage is applied to amplify and output the input signal, and a second buffer section to which a signal output from the first buffer section is supplied and a second power supply voltage is applied to amplify and output the signal outside through an output terminal; a switching element having two terminals respectively connected to the output terminal and a ground voltage terminal, and an ON resistance which changes; and a bias circuit for receiving the input signal or a signal output from the first buffer section, generating a control signal, and supplying the control signal to the switching element to control the ON resistance of the switching element so as not to allow the potential of the output terminal to exceed a predetermined value.

The first buffer section to which the first power supply voltage is applied receives and amplifies an input signal. The second buffer section to which the second power supply voltage is applied receives and amplifies a signal output from the first buffer section to output the amplified signal from the output terminal. At this time, a control signal generated by the bias circuit is supplied to the switching element arranged between the output terminal and the ground voltage terminal. The ON resistance of the switching element is controlled not to allow the potential of the output terminal to exceed a predetermined value. With this operation, when the potential of the output terminal is to exceed the predetermined value, a current flows through the output terminal and the ground voltage terminal to suppress overshooting and ringing.

It is desirable that the bias circuit output, to a gate of the transistor, a control signal having a level lower than a level equivalent to a signal output from the second buffer section by a predetermined value. In this case, a relative potential difference between the potential of the output terminal and the potential of the control signal to be supplied to the switching element can be kept at a predetermined value. In addition, the ON resistance of the switching element can be optimally controlled without being influenced by a manufacturing process, a variation in power supply voltage, and the like.

Further, the second buffer section may have first and second N-channel MOS transistors each having two terminals connected in series with each other between a second power supply voltage terminal and a ground voltage terminal, and a connection node of the first and second N-channel MOS transistors may be connected to the output terminal; the switching element may have a first P-channel MOS transistor having two terminals connected between the output terminal and a ground voltage terminal; the bias circuit may have a third N-channel MOS transistor having a drain connected to the second power supply voltage terminal, and a gate connected to the first power supply voltage terminal for applying the first power supply voltage, a second P-channel MOS transistor having a source connected to a source of the third N-channel MOS transistor, and a gate and a drain commonly connected to a first node, a fourth N-channel MOS transistor having a drain connected to the first node, a gate which receives the input signal or a signal output from the first buffer section, and a grounded source, and a third P-channel MOS transistor having a source connected to the first power supply voltage terminal, a gate which receives the input signal or a signal output from the first buffer section, and a drain connected to the first node; and the first node may be connected to a gate of the first P-channel MOS transistor.

In this case, when a signal of high level is output from the output terminal, the first N-channel MOS transistor of the second buffer section and the third N-channel MOS transistor of the bias circuit have a relationship in which a voltage applied to one terminal of the first N-channel MOS transistor is equivalent to that of the third N-channel MOS transistor. For this reason, the potential of a signal output from the source of the first N-channel MOS transistor to the output terminal is almost equal to a potential applied from the source of the third N-channel MOS transistor to the source of the second P-channel MOS transistor. With this arrangement, the potential of a control signal output from the drain of the second P-channel MOS transistor through the first node becomes lower than the potential of the output terminal by the threshold voltage of the second P-channel MOS transistor. In this manner, a relative potential difference is kept such that the potential of a control signal input to the gate of the first P-channel MOS transistor becomes lower than the potential of the output terminal by the threshold voltage of the second P-channel MOS transistor. Therefore, when the potential of the output terminal is higher than a predetermined value, the first P-channel MOS transistor is turned on to allow a current to flow through the output terminal and the ground voltage terminal. For this reason, overshooting and ringing can be effectively prevented, and an increase in feedthrough current flowing from the first N-channel MOS transistor to the first P-channel MOS transistor can be suppressed regardless of a manufacturing process and variations in power supply voltage and the like.

Still further, a resistance element may be arranged between the output terminal and the source of the first P-channel MOS transistor. In this case, a voltage lower than the potential of the output terminal by a voltage drop of this resistance element is applied to the first P-channel MOS transistor. The potential of the output terminal which turns on the first P-channel MOS transistor can be adjusted by changing the resistance of this resistance element.

BRIEF DESCRIPTION OF THE DRAWINGS

FIG. 3 is a circuit diagram showing the arrangement of a semiconductor integrated circuit according to the first embodiment of the present invention;

FIG. 4 is a circuit diagram showing the arrangement of a semiconductor integrated circuit according to the second embodiment of the present invention;

FIG. 5 is a circuit diagram showing the arrangement of a semiconductor integrated circuit according to the third embodiment of the present invention;

FIG. 6 is a circuit diagram showing the arrangement of a semiconductor integrated circuit according to the fourth embodiment of the present invention;

DESCRIPTION OF THE PREFERRED EMBODIMENTS

Embodiments of the present invention will be described below with reference to the accompanying drawings.

FIG. 3 shows the arrangement of a semiconductor integrated circuit according to the first embodiment of the present invention. The semiconductor integrated circuit of this embodiment comprises an output circuit 21, a P-type Tr TP4, and a bias circuit 22.

The output circuit 21 receives an input signal from an input terminal N6. The input signal is amplified by a pre-buffer section and a main buffer section to be output from an output terminal N12.

The P-type Tr TP4 is provided to prevent overshooting and ringing. The two terminals of the P-type Tr TP4 are connected between the output terminal N12 of an output circuit and a ground voltage terminal.

The bias circuit 22 receives an input signal and generates a control signal for controlling the ON state of the P-type Tr TP4 to input the control signal to the gate of the P-type Tr TP4.

Figure 2:
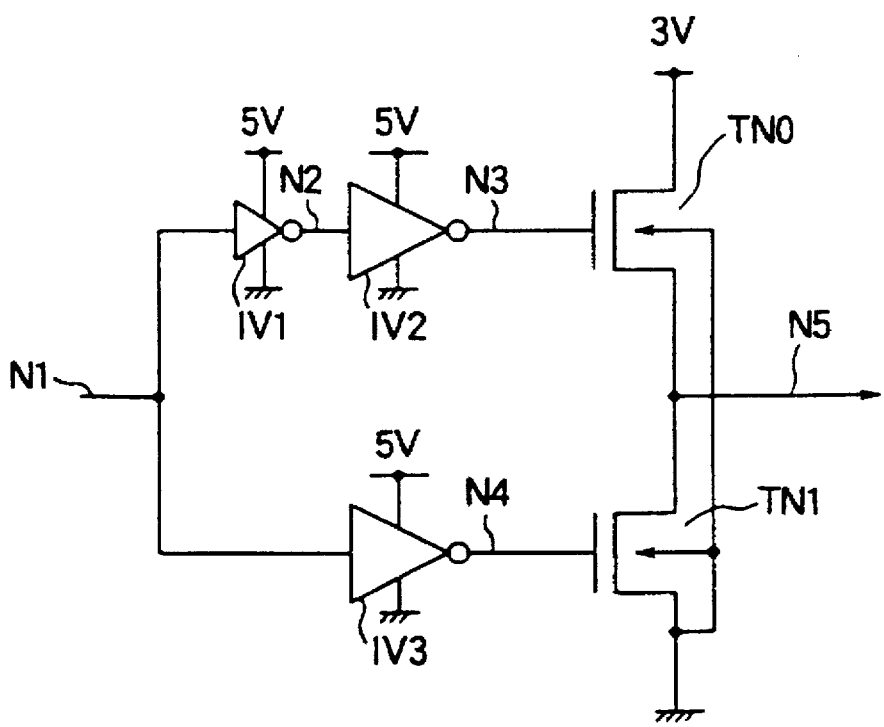
FIG. 2 is a circuit diagram showing the arrangement of a conventional semiconductor integrated circuit.

Similar to the circuit shown in FIG. 2, the output circuit 21 has inverters IV4 to IV6, which serve as the pre-buffer section and operate at a power supply voltage of 5 V, and N-type Trs TN2 and TN3, which serve as the main buffer section and operate at a power supply voltage of 3 V.

The two terminals of the P-type Tr TP4 are connected between the output terminal N12 of the output circuit 21 and the ground voltage terminal. This transistor is formed on a substrate to which a voltage of 5 V is applied.

The bias circuit 22 has N-type Trs TN4 to TN6, which are connected in series with each other between a 5-V power supply voltage terminal and a ground voltage terminal, and a P-type Tr TP2 having two terminals connected between a 5-V power supply voltage terminal and a node N10 to which the gate of the P-type Tr TP4 is connected. The N-type Tr TN4 has a drain connected to the 5-V power supply voltage terminal, a gate connected to a 3-V power supply voltage terminal, and a source connected to the node N10. The N-type Tr TN5 has a drain and gate which are connected to the node N10. The N-type Tr TN6 has a drain and source connected between the source of the N-type Tr TN5 and the ground voltage terminal, and a gate connected to the input terminal N6.

The semiconductor integrated circuit of the first embodiment having such an arrangement will operate as follows. When an input signal of high level (5 V) is input to the input terminal N6, a node N8 is set to high level (5 V), and a node N9 is set to low level in the output circuit 21 to turn on the N-type Tr TN2 and turn off the N-type Tr TN3. With this operation, the output terminal N12 is set to high level.

As described above, in the output circuit shown in FIG. 2, the output level of the output terminal N12 at this time overshoots over 3 V, and ringing occurs to make the output level of the output terminal N12 unstable. To the contrary, in the first embodiment, the newly added bias circuit 22 and P-type Tr TP4 operate as follows.

When an input signal of high level (5 V) is input to the bias circuit 22, the N-type Tr TN6 having the gate which receives the input signal is turned on, and the P-type Tr TP2 is turned off to decrease the potential of the node N10. The potential of the node N10 at this time almost corresponds to a threshold voltage Vthn of the N-type Tr TN5. This potential of the node N10 is input as a control signal to the gate of the P-type Tr TP4.

When the potential of the output terminal N12 overshoots over 3 V to increase over a voltage (Vthn+Vthp) obtained by adding the control signal input to the gate of the P-type Tr TP4, i.e., the threshold voltage Vthn of the N-type Tr TN5 to a threshold voltage Vthp of the P-type Tr TP4, the P-type Tr TP4 is turned on. As result, overshooting of the output potential of the output terminal N12 is suppressed. The output potential of the output terminal N12 is decreased to the level of Vthn+Vthp and stabilized.

At this time, a feedthrough current I flows through the 3-V power supply voltage terminal connected to the drain of the N-type Tr TN2, the N-type Tr TN2, the P-type Tr TP4, and the ground voltage terminal.

When an input signal of low level is input to the input terminal N6, the N-type Tr TN6 of the bias circuit 22 is turned off to increase the potential of the node N10. The P-type Tr TP4 having the gate which receives this potential as a control signal is turned off. In the output circuit 21, the N-type Tr TN2 is turned Off, and the N-type Tr TN3 is turned on to set the potential of the output terminal N12 to low level.

The P-type Tr TP2 and the N-type Tr TN6 in the bias circuit 22 have a function not to allow a feedthrough current to flow during a stand-by condition of the bias circuit 22. When an input signal of low level is input to the bias circuit 22, the N-type Tr TN6 is turned off, as described above, so no feedthrough current flows through the bias circuit 22. At this time, since the P-type Tr TP2 is turned on to set the node N10 to high level, and the P-type Tr TP4 is turned off, no feedthrough current flows, unlike in FIG. 10. With this operation, an increase in current consumption is prevented.

FIG. 4 shows the arrangement of a semiconductor integrated circuit according to the second embodiment of the present invention. The arrangement of a bias circuit 23 in the second embodiment is different from that in the first embodiment. In this bias circuit 23, resistors R1 and R2 are connected in series with each other between a 5-V power supply voltage terminal and an N-type Tr TN6, and a connection point between the resistors R1 and R2 is connected to a node N10 connected to the gate of a P-type Tr TP4. With this arrangement, a potential generated by resistance division of the resistors R1 and R2 is output as a control signal to the node N10. The remaining constitutional elements and the operation are the same as in the first embodiment, and a detailed description thereof will be omitted.

In the first and second embodiments, the operation of the P-type Tr TP4 is determined by a potential difference $V_{GS}$ between the output potential of the output terminal N12 connected to the drain of the p-type Tr TP4 and the potential of the node N10 connected to the gate of the p-type Tr TP4. If this potential difference $V_{GS}$ is too small, the P-type Tr TP4 is not turned on to fail to suppress overshooting of the potential of the output terminal N12. In contrast to this, if the potential difference $V_{GS}$ is too large, the ON resistance of the P-type Tr TP4 becomes too small, causing the large feedthrough current I (several mA to several tens mA) to flow. Further, the output potential of the output terminal N12 decreases below 3 V. It decreases to the potential of the node N10, i.e., a level obtained by adding the threshold voltage Vthn of the N-type Tr TN5 to the threshold voltage Vthp of the P-type Tr TP4. Alternatively, the potential of the output terminal N12 decreases to a level determined by resistance division for the N-type Tr TN2 and the P-type Tr TP4 in a state wherein the feedthrough current I flows.

In this manner, the operating state of the P-type Tr TP4 greatly differs in accordance with a relative potential difference between the output potential of the output terminal N12 and the voltage of a control signal output from the node N10 of the bias circuit 22. In order to prevent overshooting of the output potential and decrease the feedthrough current I, it is important to optimize the above potential difference.

A semiconductor integrated circuit according to the third embodiment of the present invention has an arrangement shown in FIG. 5. The feature of this embodiment is that a potential difference between a potential output from a node N12 and the potential of a control signal output from a bias circuit 24 can be optimized regardless of a manufacturing process and variations in power supply voltage and the like.

In the bias circuit 24, the two terminals of each of an N-type Tr TN7, a P-type Tr TP5, and an N-type Tr TN6 are connected in series with each other between a 3-V power supply voltage terminal and a ground voltage terminal. The N-type Tr TN7 has a drain connected to a 3-V power supply voltage terminal, and a gate connected to a 5-V power supply voltage terminal. The P-type Tr TP5 has a source connected to a node N21 together with the source of the N-type Tr TN7, and a gate and drain commonly connected to an node N10 of the bias circuit 24. The N-type Tr TN6 has a drain connected to the node N10, a gate connected to an input terminal N6, and a grounded source. The same reference numerals as in the first embodiment denote the same constituent elements in the third embodiment, and a detailed description thereof will be omitted.

When an input signal of high level is input to the input terminal N6, an N-type Tr TN2 is turned on, and an N-type Tr TN3 is turned off to increase the potential of the output terminal N12, as in the first and second embodiments.

On the other hand, an input signal is also input to the gate of the N-type Tr TN6 of the bias circuit 24 to turn on the N-type Tr TN6. A voltage of 3 V is applied to the drain of the N-type Tr TN7, and a voltage of 5 V is applied to the gate thereof. The potential of the source of the N-type Tr TN7 is set to a smaller one of 5 V—Vthn and 3 V through the node N21. This voltage relationship between the drain, source, and gate is the same as that of the N-type Tr TN2 in an output circuit 21. The N-type Tr TN7, therefore, is electrically equivalent to the N-type Tr TN2, and a potential output from the output terminal N12 of the output circuit 21 is almost equal to the potential of the node N21 of the bias circuit 24.

The P-type Tr TP5 having the drain which receives the potential of the node N21 has the short-circuited gate and drain which are connected to the node N10. For this reason, a potential lower than the potential of the node N21 by the threshold voltage Vthn is output to the node N10.

As for the P-type Tr TP5 and a P-type Tr TP4 in comparison with each other, the source potential (potential of the node N21) of the P-type Tr TP5 is equivalent to the potential of the output node N21, and the gate potential of the P-type Tr TP5 is equal to that of the P-type Tr TP4 at the potential of the node N10. The P-type Tr TP4 and the P-type Tr TP5, therefore, constitute a current mirror circuit.

If the potential of the output terminal N12 is to overshoot over 3 V, a current I flows from the output terminal N12 to the ground voltage terminal through the P-type Tr TP4 due to the presence of this current mirror circuit, thereby cutting a level higher than the output level of the output terminal N12.

When a signal of low level is input to the input terminal N6, the N-type Tr TN6 in the bias circuit 24 is turned off, and the P-type Tr TP2 is turned on to increase the potential of the node N10. Therefore, the P-type Tr TP4 is turned off. The output circuit 21 operates as in the first and second embodiments to set the potential of the output terminal N12 to low level.

According to the third embodiment, the output node. N10 of the bias circuit 24 can always output a voltage relatively lower than a voltage output from the output node N12 of the output circuit 21 by a threshold voltage Vthp of the P-type Tr TP5. Therefore, the operation of the P-type Tr TP4 can be optimally controlled regardless of a manufacturing process, a variation in power supply voltage, and the like, unlike in the first and second embodiments. With this operation, overshooting and ringing are prevented from occurring in the potential of the output terminal N12. In addition, the feedthrough current I flowing through the N-type Tr TN2 and the P-type Tr TP4 can be suppressed to be sufficiently small.

Figure 1:
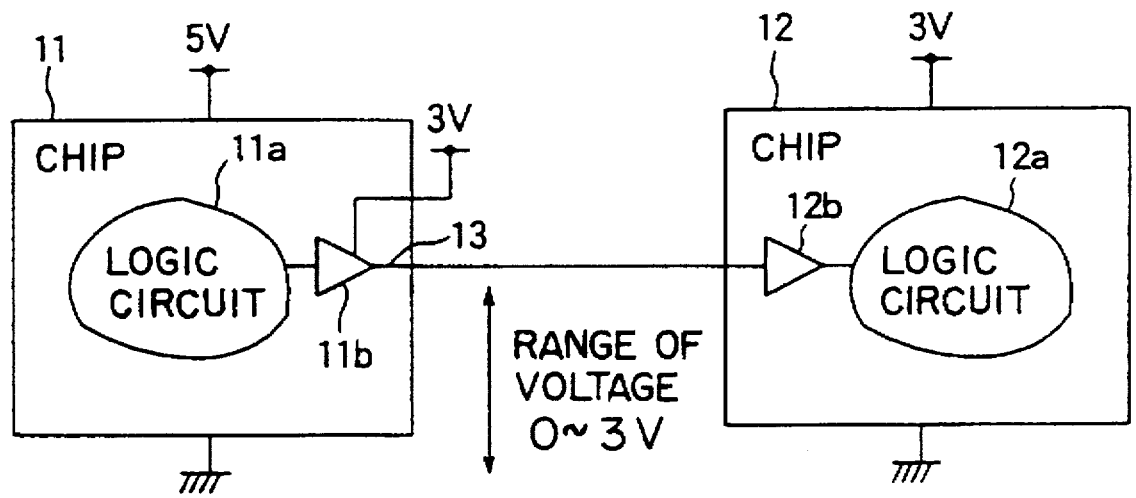
FIG. 1 is a block diagram showing an arrangement used when circuits which operate at different power supply voltages are to be connected to each other.
Figure 10:
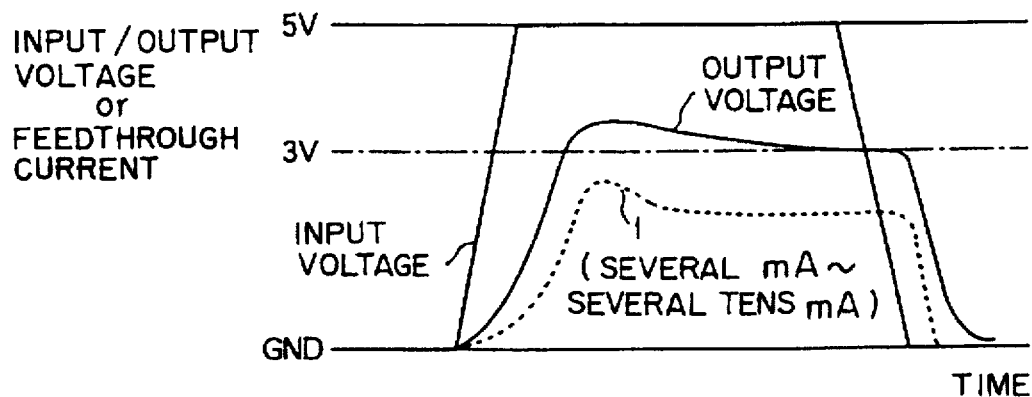
FIG. 10 is a waveform chart view showing a time change in input/output voltage and feedthrough current in the semiconductor integrated circuit according to the first or second embodiment of the present invention.
Figure 11:
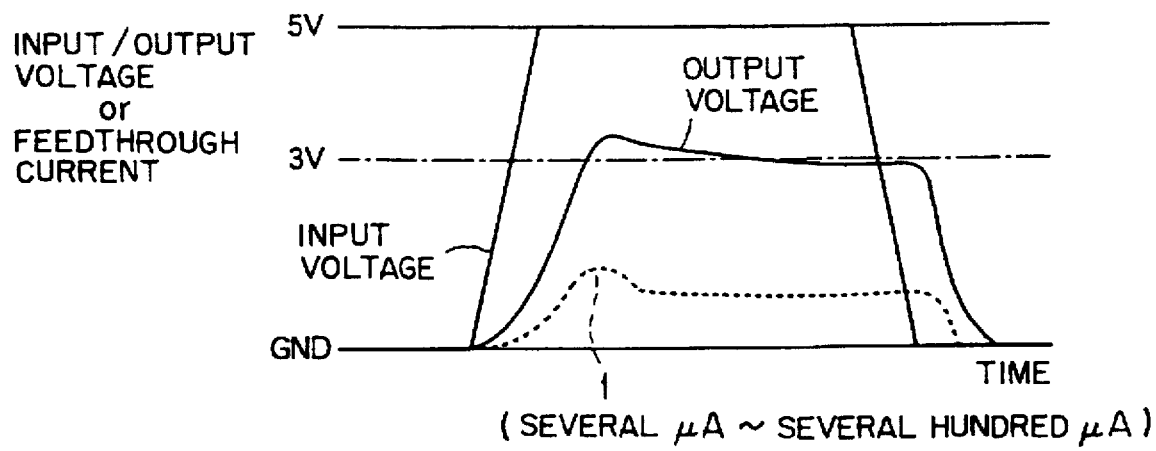
FIG. 11 is a waveform chart view showing a time change in input/output voltage and feedthrough current in the semiconductor integrated circuit according to the third embodiment of the present invention.

FIG. 10 shows a voltage output from the output terminal and the feedthrough current I in the first or second embodiment. FIG. 11 shows an output voltage and the feedthrough current I in the third embodiment. According to the first and second embodiments, overshooting and ringing are suppressed, as is apparent in comparison with an output voltage in the conventional circuit shown in FIG. 1. However, the feedthrough current I of about several mA to several tens mA flows because the P-type Tr TP4 is arranged, and overshooting is suppressed by causing a current to flow from the output terminal N12 to the ground voltage terminal. To the contrary, according to the third embodiment, the feedthrough current I can be greatly decreased to about several μA to several tens μA, as shown in FIG. 11.

FIG. 6 shows the arrangement of a semiconductor integrated circuit according to the fourth embodiment of the present invention. The fourth embodiment is different from the third embodiment in that the two terminals of a resistor R2 are connected between an output terminal N12 and the source of a P-type Tr TP4. With this resistor a voltage lower than the voltage of the output terminal N12 by the voltage drop of the resistor R2 is applied to the source of the P-type Tr TP4. As a result, when an output voltage overshoots over the voltage drop of the resistor R2, the P-type Tr TP4 is turned on. The remaining constitutional elements and the operation are the same as in the third embodiment.

Figure 7:
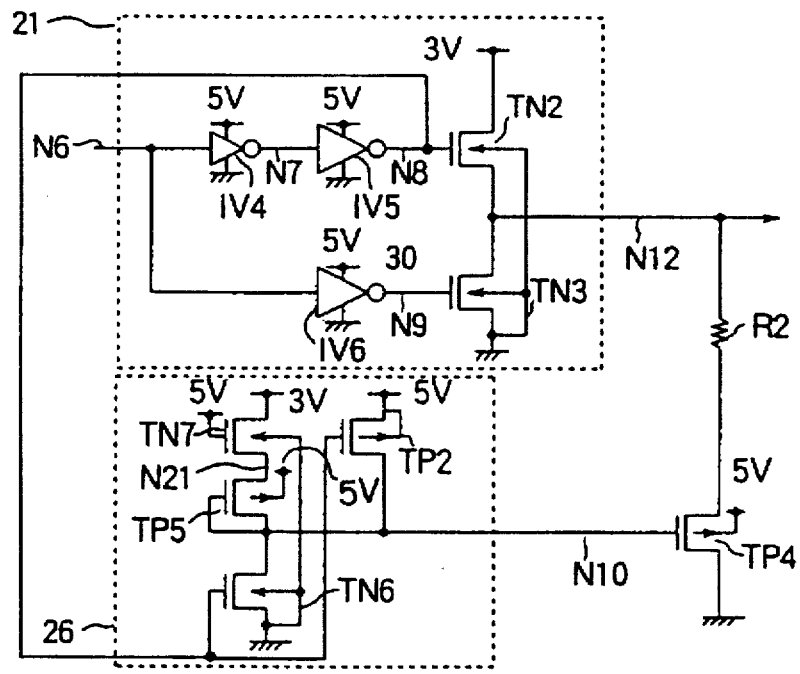
FIG. 7 is a circuit diagram showing the arrangement of a semiconductor integrated circuit according to the fifth embodiment of the present invention.

FIG. 7 shows the arrangement of a semiconductor integrated circuit according to the fifth embodiment of the present invention. The fifth embodiment is different from the fourth embodiment in that a gate voltage is applied to a P-type Tr TP2 and an N-type Tr TN6 in a bias circuit 26 through a node N8 of an output circuit 21. According to the fifth embodiment, overshooting and ringing can be effectively suppressed, and a feedthrough current can also be effectively decreased. When the fourth embodiment in which the operations of the P-type Tr TP2 and the N-type Tr TN6 are controlled by the potential of an input terminal N6 is compared with the fifth embodiment in which they are controlled by the potential of the node N8, the fourth embodiment using the potential of the input terminal N6 has slightly better response characteristics.

Figure 8:
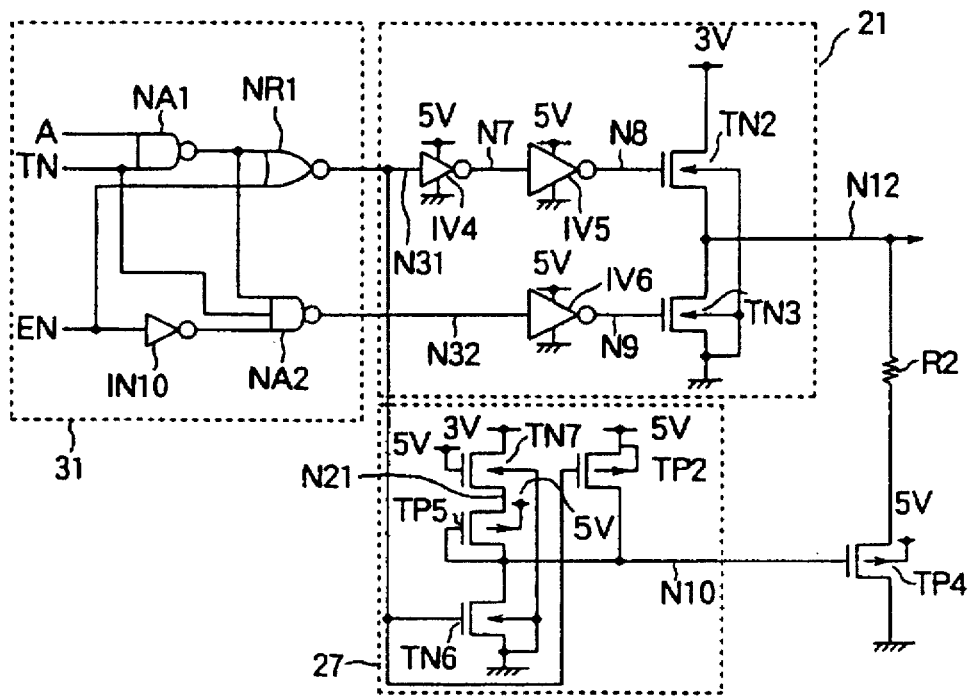
FIG. 8 is a circuit diagram showing the arrangement of a semiconductor integrated circuit according to the sixth embodiment of the present invention.
Figure 9:
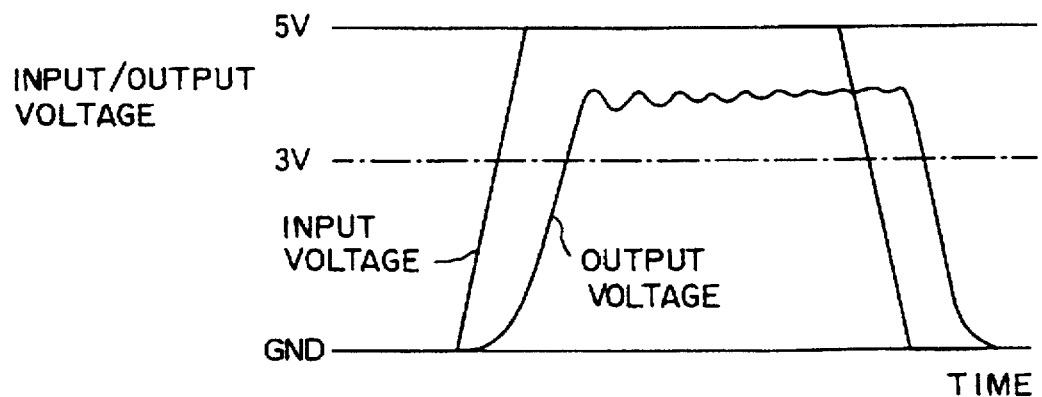
FIG. 9 is a waveform chart view showing a time change in input/output voltage in the conventional semiconductor integrated circuit.

A semiconductor integrated circuit according to the sixth embodiment of the present invention has an arrangement as shown in FIG. 8. This embodiment has a tristate-type circuit arrangement. A circuit 31 has NAND gates NA1 and NA2, a NOR gate NR1, and an inverter IN10. An input signal A and enable signals TN and EN are input to the circuit 31.

The input signal A and the enable signal TN are to the NAND gate NA1. An output from this NAND gate NA1 and the enable signal EN are input to the NOR gate NR1, and an output from this NOR gate NR1 is input to an inverter IV4 of an output circuit 21. Further, the enable signal EN is input to the inverter IN10, and an output from this inverter IN10, the enable signal TN, and an output from the NAND gate NA1 are input to the 3-input NAND gate NA2. An output from this NAND gate NA2 is input to the gate of an invertor IV6.

When the enable signal TN is at high level, and the enable signal EN is at low level, the circuit 31 is enabled. At this time, the output circuit 21, a bias circuit 27, and a P-type Tr TP4 operate in accordance with the level of the input signal A. The operations of the output circuit 21, the bias circuit 27, and the P-type Tr TP4 are the same as in the above-described second embodiment.

When the enable signal TN is at low level, or the enable signal EN is at high level, a node N31 connected to the input side of the inverter IV4 is set to low level, and a node N32 connected to the input side of the invertor IV6 is set to high level. As a result, both N-type Trs TN2 and TN3 are turned off, and an output terminal N12 has a high impedance.

The above-described embodiments are merely examples, and the present invention is not limited to them. For example, the output circuit need not be the same as those shown in FIGS. 1 to 6, and only two buffer sections which operate at different voltages are required. The bias circuit is not limited to the illustrated circuit arrangements. That is, various modifications are deemed as far as the bias circuit can control the ON operation of a switching element connected between an output terminal and a ground voltage terminal so as not to allow a signal of high level to exceed a predetermined value when this signal is to be output from the output terminal. Although the P-channel MOS transistor is used as a switching element connected between the output terminal and the ground voltage terminal in the above embodiments, the switching element is not limited to this. Any switching element can be used as far as its ON resistance changes on the basis of a control signal output from the bias circuit.

Figure 12:
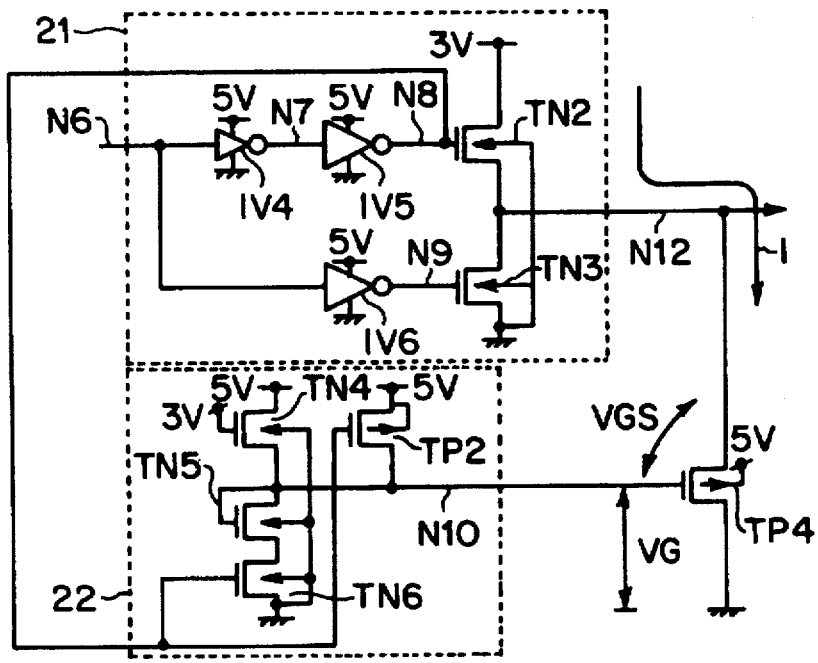
FIG. 12 is a circuit diagram showing the arrangement of a semiconductor integrated circuit according to the seventh embodiment of the present invention.
Figure 13:
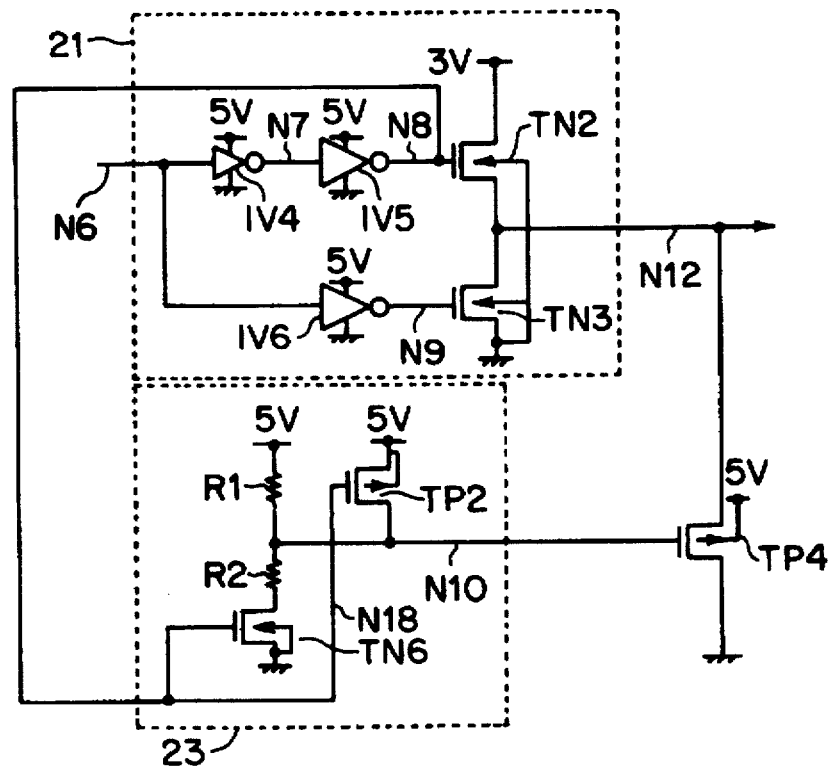
FIG. 13 is a circuit diagram showing the arrangement of a semiconductor integrated circuit according to the eighth embodiment of the present invention.
Figure 14:
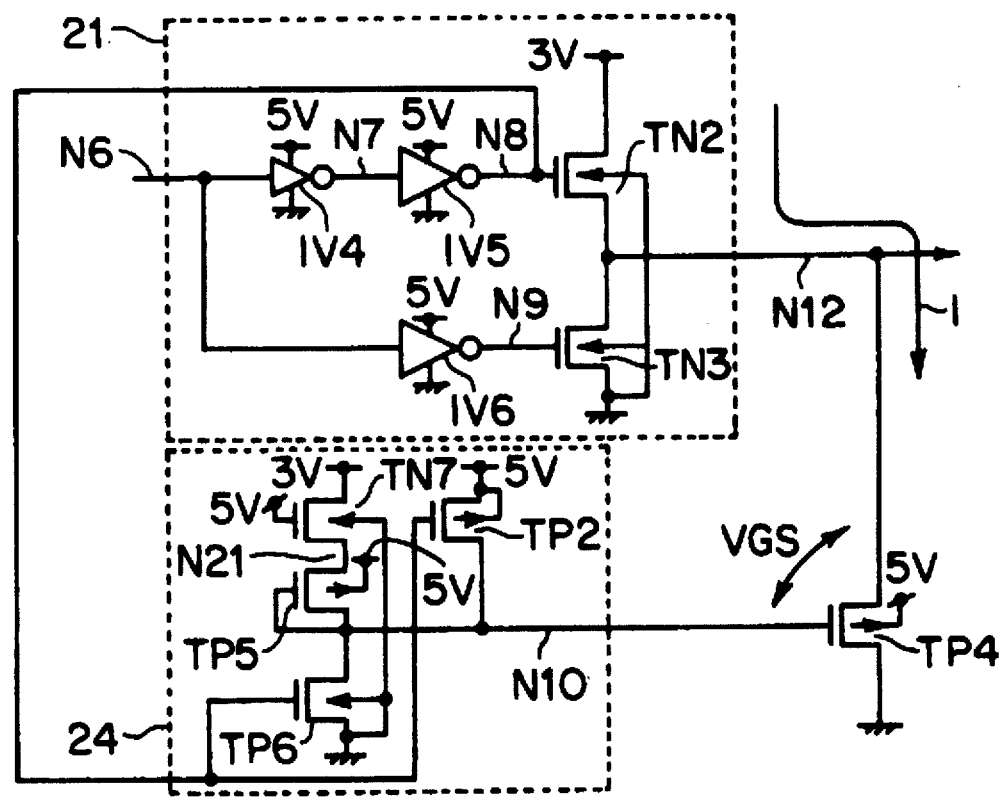
FIG. 14 is a circuit diagram showing the arrangement of a semiconductor integrated circuit according to the ninth embodiment of the present invention.

In addition, although an external input signal is supplied to the bias circuit in the above embodiments, a signal output from the first buffer section in the output circuit may be supplied to the bias circuit (see FIGS. 12–14). For example, in the first embodiment shown in FIG. 3, the output node N8 of the inverter IV5 or the output node N9 of the inverter IV6 may be connected to the gates of the N-channel transistor TN6 and the P-channel transistor TP2 in the bias circuit 22 (see FIG. 12). Alternatively, one inverter may be connected to the input of the bias circuit 22, an output node N7 of the inverter IV4 may be connected to the input terminal this inverter, and the output terminal of this inverter may be connected to the gates of the N-channel transistor TN6 and the P-channel transistor TP2.

What is claimed is:

1. A semiconductor integrated circuit comprising:

an output circuit having a first buffer section to which a first power supply voltage is applied and an input signal is supplied to amplify and output the input signal having the first power supply voltage or a ground voltage, and a second buffer section to which a second power supply voltage is applied and a signal output from said first-buffer section is supplied to amplify and output the signal having the second power supply voltage or the ground voltage through an output terminal;

a switching element which has two terminals respectively connected to said output terminal and a ground voltage terminal and receives a control signal to change a conductive resistance; and a bias circuit for receiving the input signal or the signal output from said first buffer section, generating the control signal, and supplying the control signal to said switching element to control the conductive resistance of said switching element so as not to allow a potential of said output terminal to exceed the second power supply voltage when said second buffer section outputs the signal having the second power supply voltage.

2. A circuit according to claim 1, wherein said switching element has a transistor having two terminals connected between said output terminal and the ground voltage terminal; and said bias circuit outputs, to a gate of said transistor, the control signal having a level lower than a level equivalent to the signal output from said second buffer section.

3. A circuit according to claim 1, wherein said second buffer section has first and second N-channel MOS transistors each having two terminals connected in series with each other between a second power supply voltage terminal and the ground voltage terminal, a connection node of said first and second N-channel MOS transistors is connected to said output terminal, and the signal output from said first buffer section is supplied to gates of said first and second N-channel MOS transistors;

said switching element has a first P-channel MOS transistor having two terminals connected between said output terminal and the ground voltage terminal, and a substrate terminal connected to said first power supply voltage terminal;

said bias circuit has a third N-channel MOS transistor having a drain connected to said second power supply voltage terminal, and a gate connected to said first power supply voltage terminal, a second P-channel MOS transistor having a source connected to a source of said third N-channel MOS transistor, and a gate and a drain commonly connected to a first node, a fourth N-channel MOS transistor having a drain connected to said first node, a gate which receives the input signal or the signal output from said first buffer section, and a grounded source, and a third P-channel MOS transistor having a source connected to said first power supply voltage terminal, a gate which receives the input signal or the signal output from said first buffer section, and a drain connected to said first node; and said first node is connected to a gate of said first P-channel MOS transistor.

4. A circuit according to claim 3, wherein said first buffer section has a first inverter for receiving the first power supply voltage and the input signal and for outputting an inverted signal of the input signal, a second inverter for receiving the first power supply voltage and the signal output from said first inverter and for supplying an inverted signal of the signal output from said first inverter to said gate of said first N-channel MOS transistor, and a third inverter for receiving the first power supply voltage and the input signal and for supplying an inverted signal of the input signal to said gate of said second N-channel MOS transistor.

5. A circuit according to claim 3, further comprising a resistance element, arranged between said output terminal and a source of said first P-channel MOS transistor, for adjusting a potential of said output terminal.

6. A circuit according to claim 1, wherein said second buffer section has first and second N-channel MOS transistors each having two terminals connected in series with each other between a second power supply voltage terminal and the ground voltage terminal, a connection node of said first and second N-channel MOS transistors is connected to said output terminal, and a signal output from said first buffer section is supplied to gates of said first and second N-channel MOS transistors;

said switching element has a first P-channel MOS transistor having two terminals connected between said output terminal and the ground voltage terminal, and a substrate terminal connected to said first power supply voltage terminal;

said bias circuit has a third N-channel MOS transistor having a drain connected to said first power supply voltage terminal, a gate connected to said second power supply voltage terminal, and a source connected to a first node, a fourth N-channel MOS transistor having a drain and gate commonly connected to said first node, a fifth N-channel MOS transistor having a drain connected to a source of said fourth N-channel MOS transistor, a gate which receives the input signal or the signal output from said first buffer section, and a grounded source, and a second P-channel MOS transistor having a source connected to said first power supply voltage terminal, a gate which receives the input signal or the signal output from said first buffer section, and a drain connected to said first node; and said first node is connected to a gate of said first P-channel MOS transistor.

7. A circuit according to claim 6, wherein said first buffer section has a first inverter for receiving the first power supply voltage and the input signal and for outputting an inverted signal of the input signal, a second inverter for receiving the first power supply voltage and the signal output from said first inverter and for supplying an inverted signal of the signal output from said first inverter to said gate of said first N-channel MOS transistor, and a third inverter for receiving the first power supply voltage and the input signal and for supplying an inverted signal of the input signal to said gate of said second N-channel MOS transistor.

8. A circuit according to claim 6, further comprising a resistance element, arranged between said output terminal and a source of said first P-channel MOS transistor, for adjusting a potential of said output terminal.

9. A circuit according to claim 1, wherein said second buffer section has first and second N-channel MOS transistors each having two terminals connected in series with each other between a second power supply voltage terminal and the ground voltage terminal, a connection node of said first and second N-channel MOS transistors is connected to said output terminal, and a signal output from said first buffer section is supplied to gates of said first and second N-channel MOS transistors;

said switching element has a first P-channel MOS transistor having two is connected between said output terminal and the voltage terminal, and a substrate terminal connected to first power supply voltage terminal;

said bias circuit has a first resistor having two terminals connected between said first power supply voltage terminal and a first noble, a second resistor having one terminal connected to said node, a third N-channel MOS transistor having two terminals between the other terminal of said second resistor and the ground voltage terminal, and a gate which receives the it signal or the signal output from said first buffer section, and a second P-channel MOS transistor having a source connect to said first power supply voltage terminal, a gate receives the input signal or the signal output from sa first buffer section, and a drain connected to said first node; and said first node is connected to a gate of said first P-channel MOS transistor.

10. A circuit according to claim 9, wherein said first buffer section has a first inverter for receiving the first power supply voltage and the input signal and for outputting an inverted signal of the input signal, a second inverter for receiving the first power supply voltage and the signal output from said first inverter and for supplying an inverted signal of the signal output from said first inverter to said gate of said first N-channel MOS transistor, and a third inverter for receiving the first power supply voltage and the input signal and for supplying an inverted signal of the input signal to said gate of said second N-channel MOS transistor.

11. A circuit according to claim 9, further comprising a resistance element, arranged between said output terminal and a source of said first P-channel MOS transistor, for adjusting a potential of said output terminal.

* * * * *